United States Patent
Sandoval

(10) Patent No.: US 7,364,244 B2
(45) Date of Patent: Apr. 29, 2008

(54) USER-CONTROLLABLE LATCHING CARRIER RAIL SYSTEM

(75) Inventor: Alisa Sandoval, Grass Valley, CA (US)

(73) Assignee: Hewlett-Packard Development Company, Houston, TX (US)

( * ) Notice: Subject to any disclaimer, the term of this patent is extended or adjusted under 35 U.S.C. 154(b) by 366 days.

(21) Appl. No.: 10/437,525

(22) Filed: May 14, 2003

(65) Prior Publication Data

US 2004/0227443 A1    Nov. 18, 2004

(51) Int. Cl.
*A47B 88/04*    (2006.01)
(52) U.S. Cl. .................... 312/333; 312/334.46
(58) Field of Classification Search ............ 312/330.1, 312/333, 334.1, 334.7, 334.8, 334.44, 334.47, 312/348.6, 265.4, 332.1; 211/26, 187, 190
See application file for complete search history.

(56) References Cited

U.S. PATENT DOCUMENTS

| | | | | |
|---|---|---|---|---|
| 2,789,024 | A | * 4/1957 | Heisler | 312/333 |
| 3,133,768 | A | * 5/1964 | Klakovich | 384/17 |
| 4,006,951 | A | 2/1977 | Geer et al. | |
| 4,200,342 | A | * 4/1980 | Fall | 384/19 |
| 4,423,914 | A | 1/1984 | Vander Ley | |
| 5,033,805 | A | * 7/1991 | Hobbs | 312/334.11 |
| 5,823,649 | A | 10/1998 | Hinrichs | |
| 5,833,337 | A | * 11/1998 | Kofstad | 312/334.5 |
| 6,230,903 | B1 | * 5/2001 | Abbott | 211/26 |
| 6,238,031 | B1 | * 5/2001 | Weng | 312/333 |
| 6,373,707 | B1 | * 4/2002 | Hutchins | 361/725 |
| 6,386,659 | B1 | * 5/2002 | Muller et al. | 312/334.38 |
| 6,398,041 | B1 | * 6/2002 | Abbott | 211/26 |
| 6,457,790 | B1 | * 10/2002 | Liang et al. | 312/334.46 |
| 6,796,625 | B2 | * 9/2004 | Lauchner et al. | 312/334.46 |
| 6,805,418 | B2 | * 10/2004 | Milligan | 312/333 |
| 6,817,685 | B2 | * 11/2004 | Lammens | 312/334.47 |
| 6,883,884 | B2 | * 4/2005 | Chen et al. | 312/333 |
| 6,942,307 | B1 | * 9/2005 | Lammens | 312/334.46 |

FOREIGN PATENT DOCUMENTS

DE              29919738         * 4/2000

* cited by examiner

*Primary Examiner*—James O. Hansen
(74) *Attorney, Agent, or Firm*—Connolly Bove Lodge & Hutz, LLP

(57) ABSTRACT

A system rack configured to house rack-mount modules comprising a support structure; a rack-mount module slidingly mounted within the support structure; a carrier rail system slidingly supporting the module and comprising a pair of linear slides each secured to the support structure on opposing sides of the module, each linear slide comprising a stationary slide rail fixed to the support structure and one movable slide rail linear translatable relative to the stationary slide rail and fixed to the module; and a user-controllable latching mechanism operatively coupled to the module to releasably restrain the module in at least one position relative to the support structure.

14 Claims, 8 Drawing Sheets

FIG. 5A
FIG. 5B
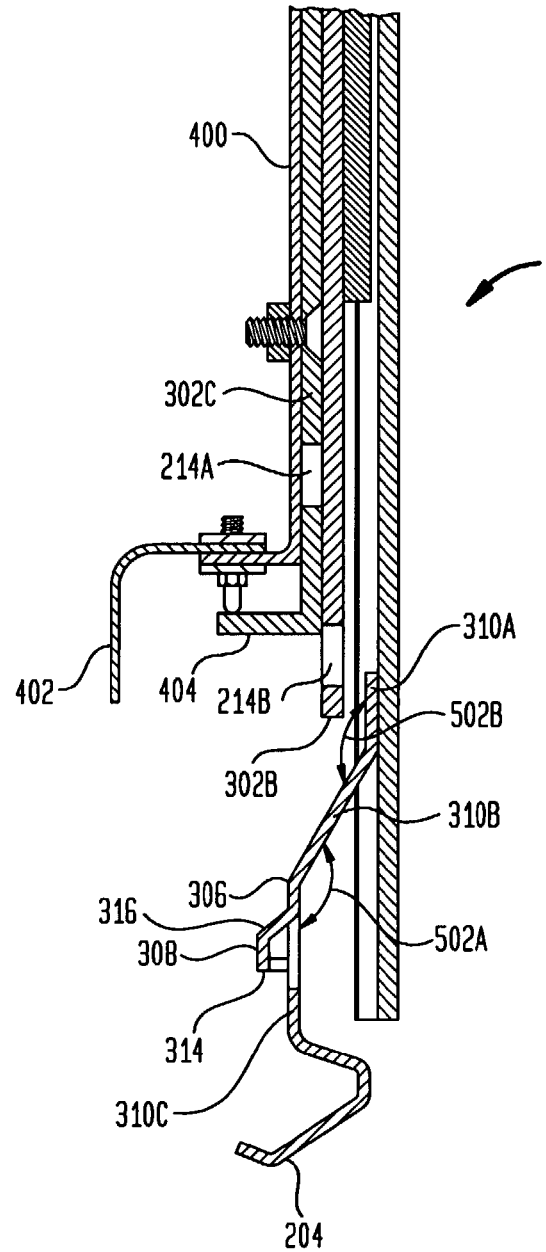
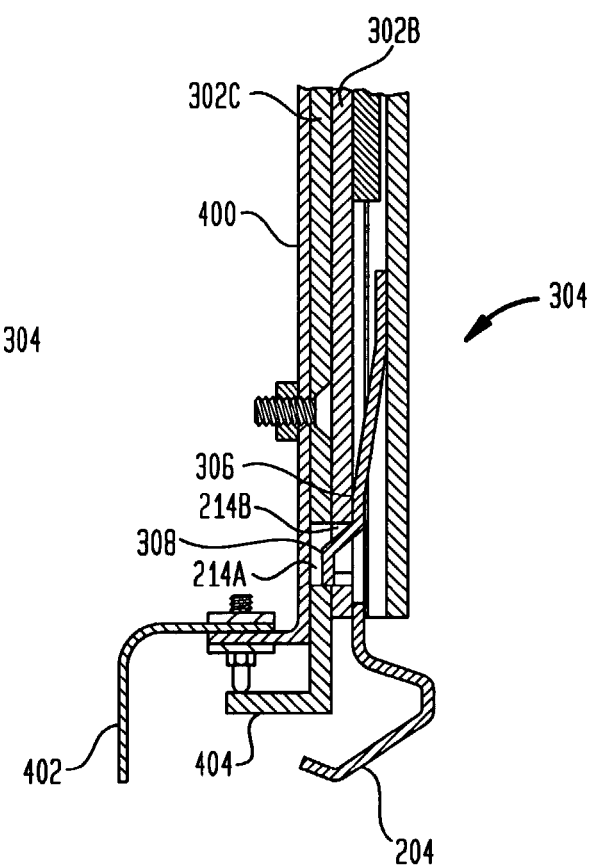

USER-CONTROLLABLE LATCHING CARRIER RAIL SYSTEM

BACKGROUND

Computers such as servers and the like are enclosed within an electronics rack or enclosure that provides multiple functions such as protecting operating components from damage and shielding against undesirable electromagnetic emissions. With the advent of computer rooms and data centers, and the more recent trend toward collocation facilities, such electronics enclosures are often configured to be mounted in a standard-size cabinet commonly referred to as a system rack, enclosure or cabinet. Such a cabinet, referred to herein as a system rack or, more simply, a rack, can house multiple collocation computers and other systems such as fan assemblies and wiring patch bays. These and other devices and systems which are configured to be mounted in a system rack are generally and collectively referred to herein as rack-mount modules.

Rack-mount modules are commonly installed in system racks by directly or indirectly fastening the modules to the rack. Such arrangements sometimes utilize a bracket or tray also fastened to the rack to provide additional support for the installed module. When installed in this way the module remains in a stationary position relative to the rack while the module is in operation. Access to such a module requires the module to be taken off-line, unfastened and physically separated from the rack, and placed on a floor, bench, table or other supporting surface. Such a mounting approach is suitable for many rack-mount modules.

However, the current trend has been to provide rack-mount modules that require periodic and/or rapid access. For example, certain modules such as servers contain hot-plug components (e.g., PCI cards) that can be replaced online. Such modules are typically mounted on a carrier rail system in the system rack so that the module can be serviced without interrupting real-time operations. FIGS. 1A-1C are three schematic side-views of a system rack 100 with a rack-mount module 102 mounted on a conventional carrier rail system 104. Carrier rail systems (also commonly referred to as slide rails and guide rails) provide mechanical support for module 102 along a continuum of positions relative to system rack 100, including a number of interior 108 and adjacent exterior positions 110. Traditionally, a carrier rail system includes two linear slides interposed between module 102 and system rack 100 on opposing sides of the module. (Typically, the linear slides are located on the left and right sides of the module from the perspective of a person facing the front of an installed module. This left and right reference will be used throughout this application.) In FIG. 1A, module 202 is in an interior position 108; in FIG. 1B, module 202 is in a partially-extracted exterior position 110A; and in FIG. 1C, module 202 is in a fully-extracted exterior position 110B. It should be appreciated that only the left linear slide is illustrated in the FIGS. 1A-1C; a similar right linear slide on the opposing side of module 102 is hidden from view.

Each linear slide traditionally includes a stationary slide rail secured directly or indirectly to system rack 100, and at least one movable slide rail one of which is secured to a side of module 102. To gain access to module 102, a user slides the module out of the system rack; that is, the user repositions the module from an interior position 108 in system rack 100 to a desired exterior position 10 at least partially outside the rack. Typically, to facilitate ease of access, modules 102 are not restrained in the interior position and are free-floating on the linear slides. As such, a user need only apply a minimal force to reposition module 202 on carrier rail system 104.

Typically, system rack 100 is provided with wheels to facilitate the repositioning of the rack in the same or another data center. During transport, a module 102 mounted on conventional carrier rail system 104 may inadvertently slide to a position outside of the rack. Depending on the component weight, the speed at which the module slides out of the rack, and the elevation of the module in the rack, the rack may tip over, injuring people and damaging equipment. To avoid this, some conventional system racks are provided with a anti-tilt bracket 106, and are accompanied with instructions to install heavy, rail-based modules in lower positions in the system rack. Such precautions, however, cannot always be followed, and fail to protect the system rack and its components under many circumstances.

SUMMARY

In one aspect of the invention, a system rack configured to house rack-mount modules is disclosed. The system rack comprises a support structure; a carrier rail system slidingly supporting a module and comprising a pair of linear slides each secured to the support structure on opposing sides of the module. Each linear slide comprises a stationary slide rail fixed to the support structure, and one movable slide rail linear translatable relative to the stationary slide rail and fixed to the module. The system rack further comprises a user-controllable latching mechanism operatively coupled to the module to releasably restrain the module in at least one position relative to the support structure.

In a further aspect of the invention, a carrier rail system for slidingly mounting a module to a support structure is disclosed. The carrier rail system releasably secures a module at a predetermined position relative to the support structure. The carrier rail system comprises at least one linear slide comprising a stationary slide rail fixed to the support structure and a movable slide rail linear translatable relative to the stationary slide rail and fixed to the module. The carrier rail system also comprises a user-controllable latching mechanism operatively coupled to one or more of the carrier rail system, module and support structure to releasably latch the module in at least one position relative to the support structure.

In a still further aspect of the invention, a latching mechanism to releasably latch in a restrained position a module slidingly mounted on a carrier rail system is disclosed. The carrier rail system comprises at least one linear slide having a stationary slide rail fixed to a support and one movable slide rail linearly translatable relative to the stationary slide rail and fixed to the module. The latching mechanism comprises a movable latching member movable between a latched and an unlatched position and operatively connected to the module; a stationary latching member fixedly coupled to the support structure and latchable with the movable latching member when the module is in the restrained position relative to the support structure. The latching mechanism also comprises a user-accessible handle disposed on a proximal end of the movable latching member, wherein the handle is operable to move the movable latching member between the latched and unlatched positions.

BRIEF DESCRIPTION OF FIGURES

The structure and operation of various embodiments of the present invention are described in detail below with reference to the accompanying drawings, in which:

FIG. 5A is a cross-sectional view of the linear slide illustrated in FIGS. 3A and 3B in its unlatched position; and FIG. 5B is a cross-sectional view of the linear slide illustrated in FIG. 5A in its latched position.

DETAILED DESCRIPTION

Figure 1A:
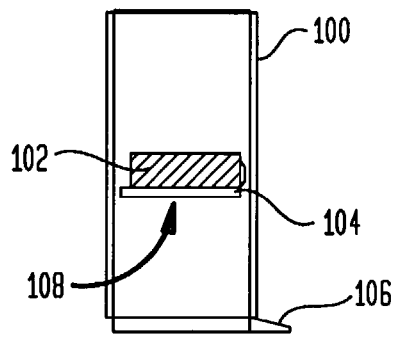
FIG. 1A is a schematic side view of a system rack with a rack-mount module mounted in an interior position in the rack with a conventional carrier rail system.
Figure 1B:
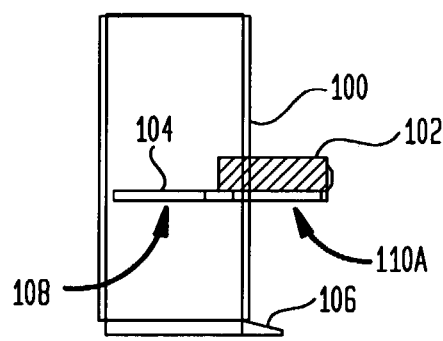
FIG. 1B is a schematic side view of a system rack with a rack-mount module mounted in an exterior position in the rack with a conventional carrier rail system.
Figure 1C:
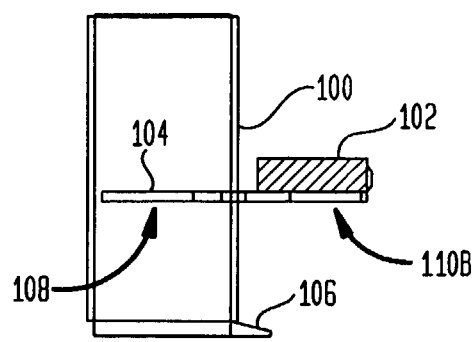
FIG. 1C is a schematic side view of a system rack with a rack-mount module mounted in another exterior position in the rack with a conventional carrier rail system.
Figure 2A:
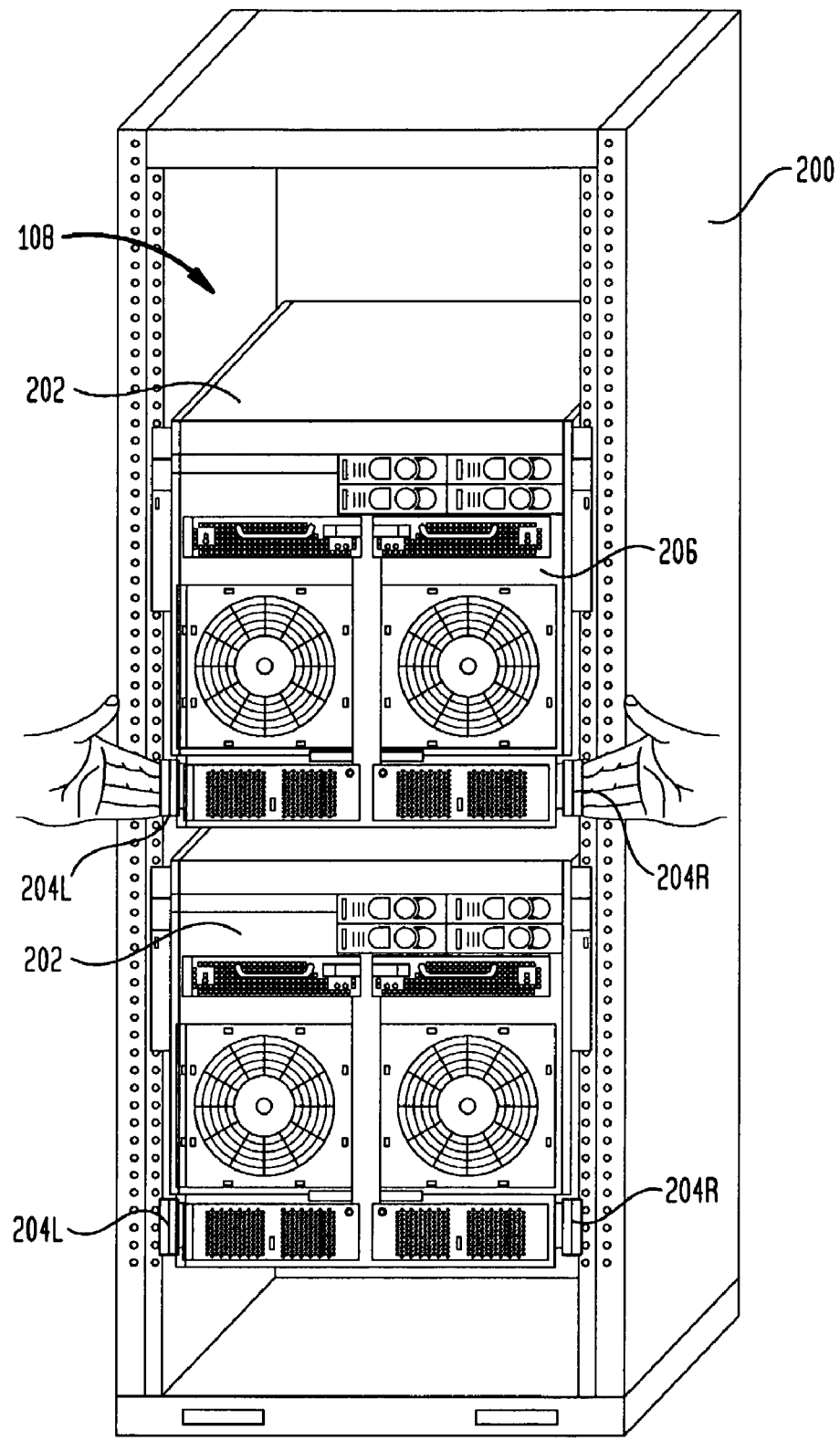
FIG. 2A is a perspective view of a system rack for housing rack-mount modules in accordance with the teachings of the present invention.

FIG. 2A is a perspective view of a four-post system rack 200 in which rack-mount modules 202 are mounted in the rack in accordance with the teachings of the present invention. System racks such as standard server racks commonly used in computer rooms, collocation facilities and other data centers (collectively, "data centers") are configured to operationally secure electronics equipment housed in rack-mount enclosures. The electronics systems are generally computers and, in particular, servers, server blade systems, as well as other equipment, as noted above. In the exemplary application shown in FIG. 2A, two server systems 202 are installed in system rack 200. In the following description, server systems 202 as well as any other system housed in a rack-mount enclosure are generally and collectively referred to as rack-mount modules 202.

Figure 2B:
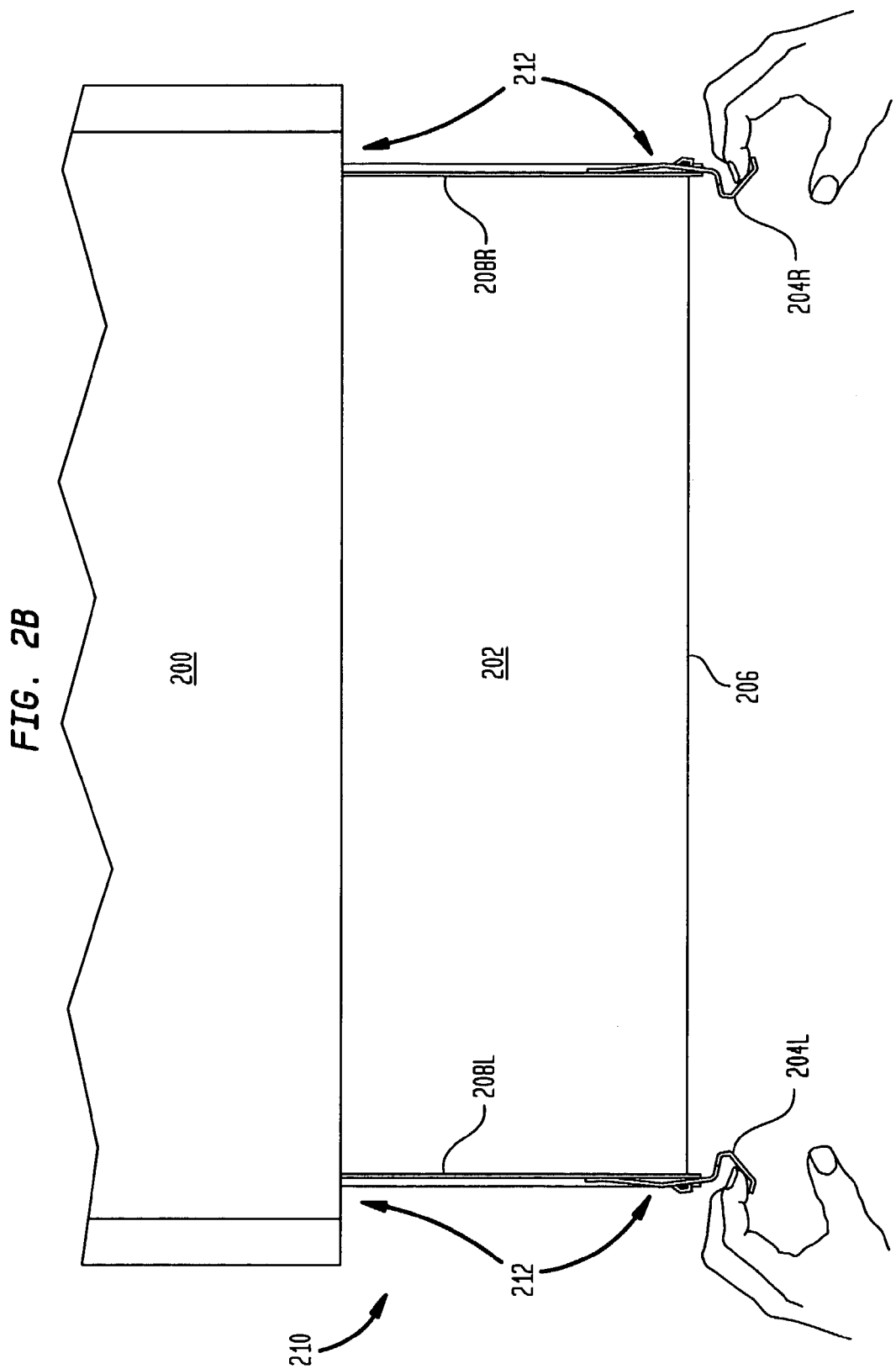
FIG. 2B is a schematic top-down view of a user sliding a rack-mount module from system rack using one embodiment of a carrier rail system of the invention.

FIG. 2B is a schematic top-down view of a user sliding rack-mount module 202 from system rack 200. In FIG. 2B rack-mount module 202 is shown in a partially-extracted exterior position 110. The present invention is directed to a carrier rail system 210 on which a rack-mount module 202 can be mounted to facilitate the supported repositioning of the module relative to the system rack. Carrier rail system 210 comprises one or more linear slides 208 each having a latching mechanism 212 (a portion of which is visible in FIG. 2B) which releasably restrains rack-mount modules 202 in, for example, an interior position 108 in system rack 200. In the embodiment illustrated in FIGS. 2A and 2B, each rack-mount module 202 is mounted in system rack 200 with two linear slides 208L and 208R. Carrier rail system 210 enables a user to release module 202 from a restrained position so that the module can be repositioned on the carrier rail system 210. In this example, carrier rail system 210 enables a user to release module 202 from a restrained interior position 108, and to slide the module out of rack 200 on the carrier rail system's linear slides 208L and 208R.

Latching mechanism 212 (described below) of carrier rail system 210 is, in this embodiment, manually controllable by the user. Handles 204L and 204R are provided on proximal ends of left and right linear slides 208L and 208R, respectively, as described below. Handles 204 are accessible to a user facing the front of system rack 200. In the embodiment illustrated in FIGS. 2A and 2B, for example, handles 204 are forward of and adjacent to a front face 206 of rack-mount module 202. To release or unlatch module 202 from its retrained interior position 108, a user manually adjusts handles 204 as described below, and slides module 202 from the rack until the module is in a desired exterior position 110 supported by carrier rail system 210.

Rack-mount module 202 is preferably free-floating on linear slides 208 of carrier rail system 210. That is, linear slides 208 are constructed and arranged to provide sufficient physical support for rack-mount module 202 so that minimal force is required to reposition a released or unlatched module 202. This user-controllable latching mechanism 212 prevents modules 202 from inadvertently sliding out of system rack 200 while providing the user with the ability to quickly and easily reposition modules 202 as needed. Thus, the carrier rail system of the present invention comprises a user-controllable latching mechanism 212 that enables a user to release a restrained module 202, thereby enabling a user to reposition the module from an interior position 108 to an exterior position 110. When placing a module 202 into system rack 200, the user can perform similar or converse operations to place the module in a latched or restrained position in system rack 200. Alternatively, latching mechanism 212 can latch automatically; that is, linear slides 208 can be self-latching as described below.

It should be appreciated that handles 204 eliminate the need for the user to grasp some other feature of rack-mount module 202 to reposition the module to a desired position on carrier rail system 210. Due to the architecture of many of today's system racks and conventional carrier rail systems, it is not uncommon for rack-mount modules to not provide a handle or other feature for such a purpose. Thus, one advantage of certain embodiments of the present invention is that a user can perform both tasks; that is, latching/unlatching and repositioning the module in two sequential operations without having to reposition his/her hands from handles 204; a single integrated operation is all that is necessary. This is described in greater detail below.

Figure 3A:
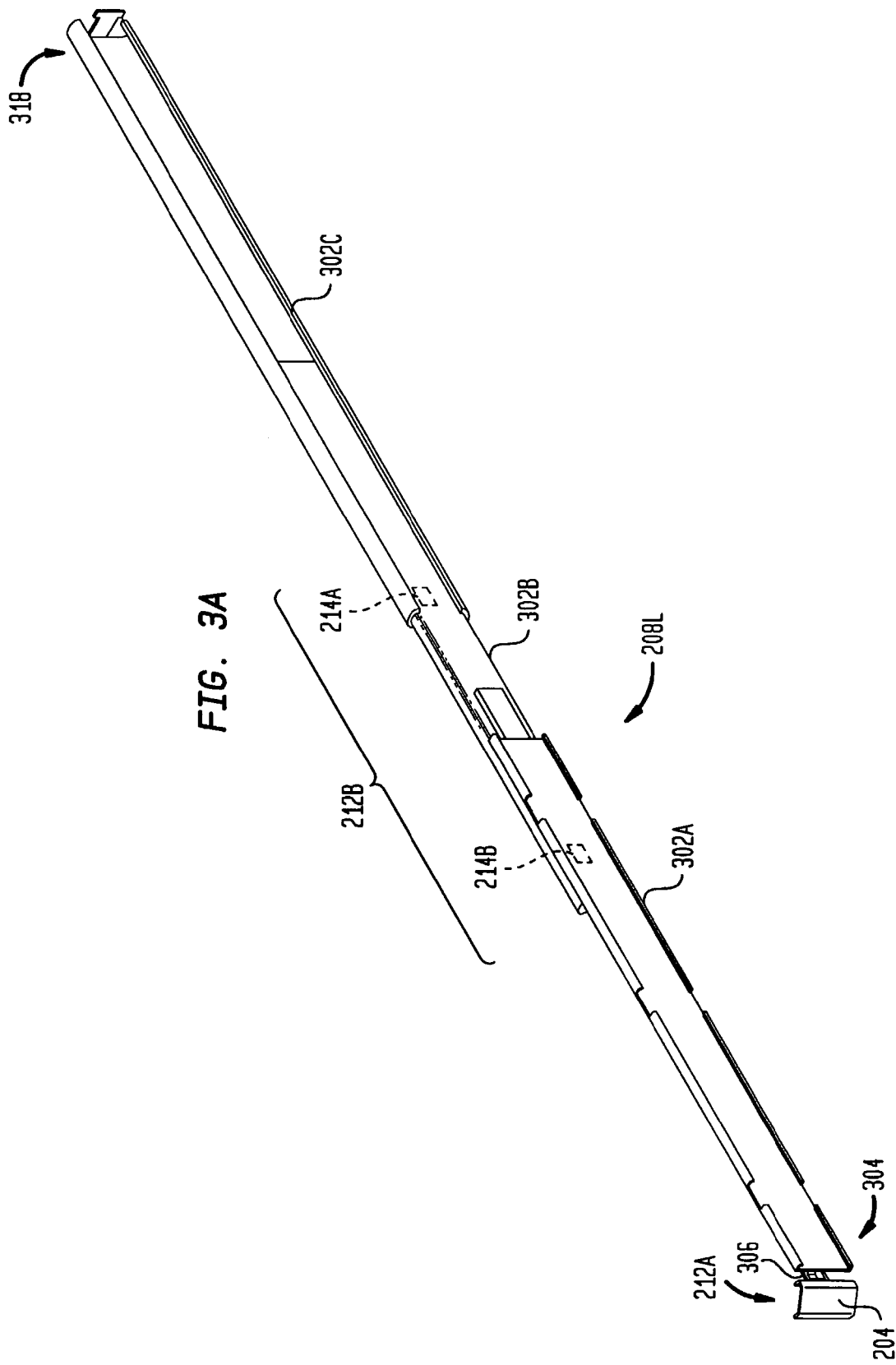
FIG. 3A is a perspective rear side view of a left linear slide in accordance with one embodiment of the present invention.
Figure 3B:
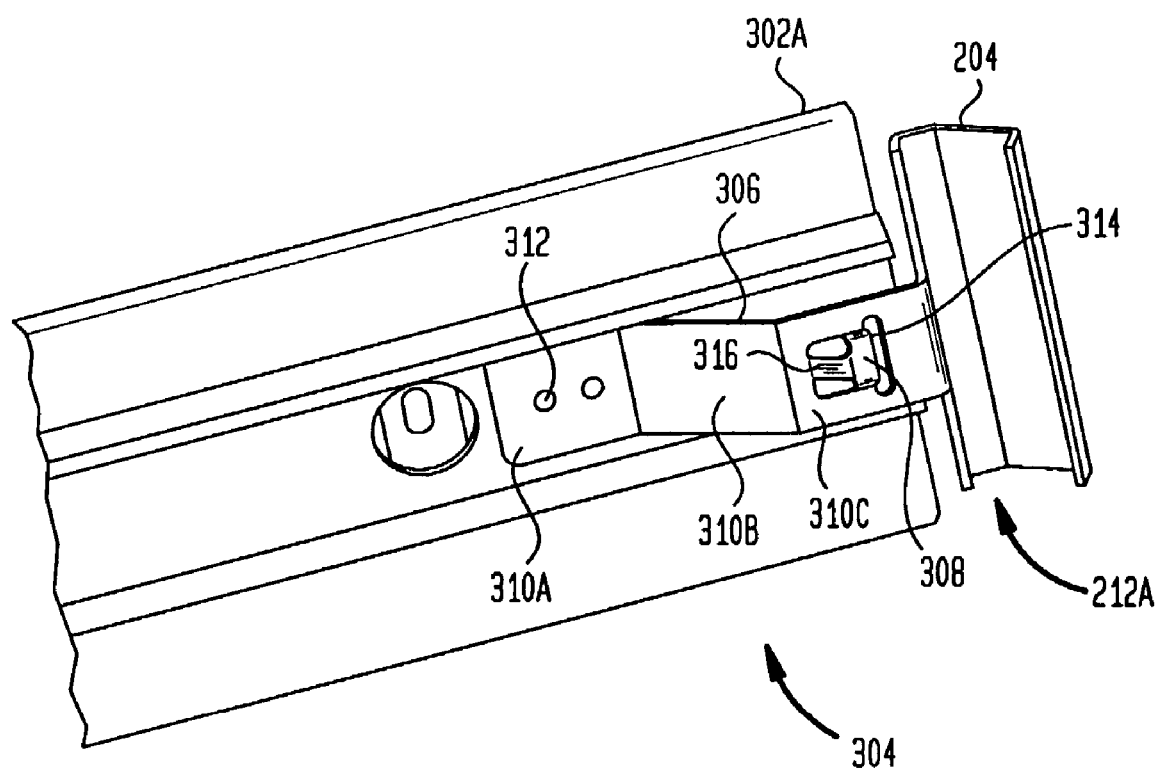
FIG. 3B is a perspective front side view of a left linear slide illustrated in FIG. 3A.
Figure 4A:
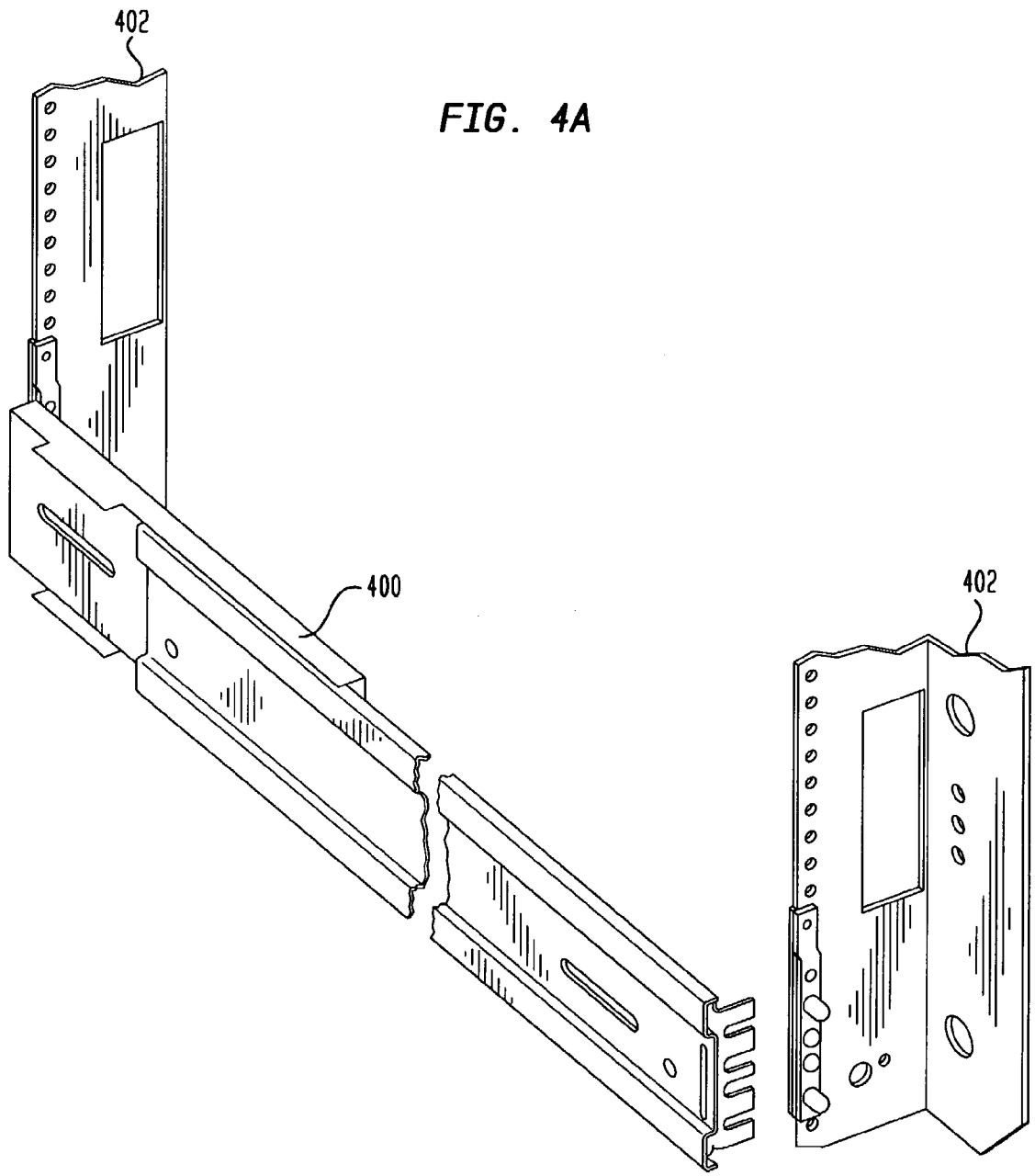
FIG. 4A is a perspective view of an exemplary carrier rail bracket that can be used to mount the linear slide illustrated in FIGS. 3A and 3B to the system rack illustrated in FIG. 2A.
Figure 4B:
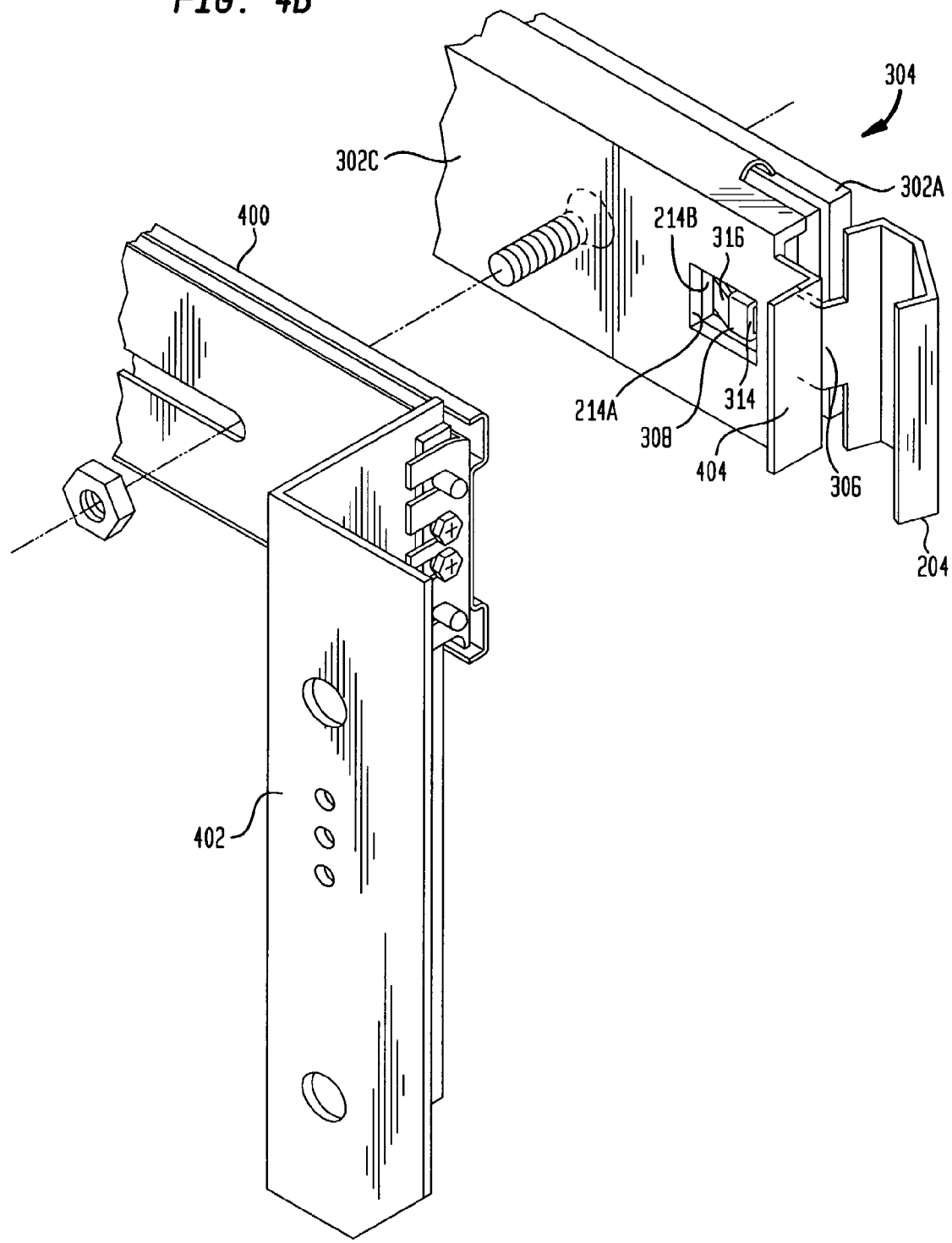
FIG. 4B is a perspective view of the carrier rail bracket illustrated in FIG. 4A and the linear slide illustrated in FIGS. 3A and 3B in accordance with one embodiment of the present invention.

The above-noted exemplary embodiment of a carrier rail system of the invention will now be described in detail with reference to FIGS. 3A-5B. FIGS. 3A and 3B are perspective side views of opposing sides of one embodiment of left linear slide 208L. FIGS. 4A and 4B are perspective views of an exemplary carrier rail bracket that can be used to mount a linear slide to a system rack. FIGS. 5A and 5B are cross-sectional views of one embodiment of a linear slide in its unlatched and latched positions, respectively.

The term carrier rail system refers broadly to the combination of elements that can be implemented to slidingly mount any component in any cabinet, such as rack-mount module 202 in system rack 200. Referring now to FIGS. 3A and 3B, FIG. 3A is a perspective rear view of the entire linear slide 208L in its fully extended state while in FIG. 3B a perspective front view of only proximal end 304 of linear slide 208L is shown. In many Figures only left carrier rail assembly 208L is illustrated. It should be understood that unless otherwise noted the associated description applies to both, left and right carrier rail assemblies 208L and 208R. As used herein, the term linear slide refers broadly to any multi-member device in which one member can be linearly translated relative to another member on, for example, ball bearings and the like. Linear slides are well-known devices and, therefore, are not described in detail herein.

In this exemplary embodiment, linear slide 208L comprises three slide rails 302A, 302B and 302C, as illustrated in FIG. 3A. Slide rails 302 are telescopically coupled to each other in a well-known manner. When installed in system rack 200 to support rack-mount module 202, slide rail 302C is fixedly coupled to system rack 200 and, therefore, remains stationary during the repositioning of module 202 or carrier rail system 210. Slide rail 302C is, therefore, sometimes referred to as a stationary slide rail. Oftentimes, stationary slide rail 302C is not directly connected to system rack 200. Rather, as shown in FIGS. 4A and 4B, a carrier rail bracket 400 is first mounted between two posts 402 of system rack 200 to provide the proper support structure to which stationary slide rail 302C can be secured. Slide rail 302A is secured to rack-mount module 202 and, therefore, linearly translates relative to stationary slide rail 302C during the repositioning of module 202. Similarly, slide rail 302B is an intermediate slide rail telescopically coupled to slide rails 302A and 302C. As such, slide rail 302B linearly translates relative to slide rails 302C and 302A during the repositioning of module 202.

As noted, latching mechanism 212 releasably restrains rack-mount module 202 in a desired position on carrier rail system 210, such as at an interior position 108 within system rack 200. In accordance with certain embodiments of the present invention, both linear slides 208L and 208R comprises all or part of a latching mechanism 212. It should be appreciated that in alternative embodiments and applications only one linear slide 208 of a carrier rail system 210 can implement a latching mechanism 212 of the present invention.

It should also be appreciated that the latching mechanism of the present invention can be any mechanism operable with system rack 200 and/or carrier rail system 210 to releasably restrain rack-mount module 202 in a desired position on carrier rail system 210. In the illustrative embodiment, latching mechanism 212 is comprised of cooperating mechanical features integrated on slide rails 302A and 302C. Specifically, latching mechanism 212 comprises, in one illustrative embodiment, a movable latching member 212A disposed on proximal end 304 of linear slide 208L. As noted, slide rail 302A is secured to rack-mount module 202. As such, movable latching member 212A is fixedly coupled to module 202. Latching mechanism 212 further comprises a stationary latching member 212B that is fixed directly or indirectly to system rack 200. Stationary latching member 212B cooperates with movable latching member 212A to releasably restrain module 202 as described herein. In this particular example, when the latching mechanism 212 is in a latched position, it prevents linear translation of slide rail 302A relative to stationary slide rail 302C and, when unlatched, does not provide such a restraint. As will be described in detail below, movable latching member 212A is manually-adjustable by the user to restrain and/or release module 202 in a desired position in the rack.

More particularly, in this illustrative embodiment, movable latching member 212A is comprised of a protrusion 308 mechanically biased away from slide rail 302A on a flat spring 306, as shown in FIGS. 3B and 5A. Protrusion 308 cooperates with aperture 214A disposed in slide rail 302C to latch slide rail 302A to slide rail 302C. When module 202 is in an interior position 108 in which protrusion 308 is aligned with apertures 214, biased flat spring 306 advances protrusion 308 into apertures 214 to restrain module 202 in interior position 108. To release module 202, the user grasps handle 204 which is also disposed on the biased end of flat spring 306. The user then laterally adjusts handle 204 away from its biased position; that is, inward toward module 202, as illustrated in FIGS. 2B and 5B. This operation causes protrusion 308 to retract from aperture 214A, thereby releasing module 202. Once released, the user can simply pull module 202 forward, causing the module to slide along linear slides 208L and 208R into a desired exterior position 110.

As shown in FIGS. 3A, 5A and 5B, when linear slide 208L is completely retracted, slide rail 302B is interposed between protrusion 308 and aperture 214A. In this particular embodiment, then, slide rail 302B also includes an aperture 214B that aligns with aperture 214A to enable protrusion 308 to extend through slide rail 302B into aperture 214A to latch the slide rails together. Thus, in this embodiment, stationary latching member 212B simply comprises appropriately configured apertures 214, as shown in FIG. 3A.

It should be appreciated that protrusion 308 can be retracted from or disengaged with aperture 214A and not aperture 214B. In such a circumstance, slide rails 302A and 302B cannot linearly translate relative to each other, but together, can translate relative to stationary slide rail 302C. This enables module 202 to be partially extracted from system rack 200. It should also be appreciated that in alternative embodiments, slide rail 302B is not interposed between slide rails 302A and 302C when linear slide 208L is fully retracted. For example, in one embodiment, the relative lengths of slide rails 302A-302C are such that intermediate slide rail 302B is shorter than slide rails 302A and 302B. In another embodiment, linear slide 208L is comprised of two rather than three slide rails 302. In such embodiments, protrusion 308 need not be configured to extend through an intermediate slide rail 302B. It should be further understood that more than one aperture 214 can be formed in either slide rail 302C and 302B so that module 202 can be latched in a variety of interior and exterior positions.

As shown in FIGS. 3B, 5A and 5B, biased flat spring 306 has a plurality of substantially planar portions 310A-310C. A distal portion 310A is generally in a direction toward distal end 318 (FIG. 3A) of linear slide 208L, while a proximal portion 310C is generally in a direction toward a proximal end 304 of linear slide 208L. Intermediate portion 310B is integral with and interposed between distal and proximal portions 310A, 310C. In this particular embodiment, distal portion 310A is approximately parallel with and attached to slide rail 302A, such as by rivets 312. Proximal portion 310C is approximately parallel with and spaced from slide rail 302A. Intermediate portion 310B is formed so as to be at an angle 502A with proximal portion 310C and at an angle 502B with respect to distal portion 310A (FIG. 5A), so that intermediate portion 310 angles away from slide rail 302A to place proximal portion 310C in the noted biased position. Thus, in this particular embodiment, intermediate portion 310B serves as a biased lever arm to maintain proximal portion 310C of flat spring 306 in the latched position as shown in FIGS. 4B and 5B.

As shown in FIG. 3B, protrusion 308 is formed as a raised surface on proximal portion 310A of flat spring 306, extending toward system rack 200 and away from module 202. Locking protrusion 308 has a proximal face 314 which is perpendicular to the linear axis of slide rails 302. When protrusion 308 is located in aperture 214A, perpendicular face 314 will abut an edge of aperture 214A to prevent substantial relative movement between slide rails 302A and 302C (thereby preventing, for example, the extraction of module 202 from system rack 200). As one of ordinary skill in the art would find apparent, the relative size of protrusion 308 and aperture 214A can be selected to achieve a desired interoperability and relative movement while in the latched position. It may be preferable from a manufacturing and operational tolerance standpoint, for example, to allow some limited horizontal movement of module 202 when module 202 is in a restrained or latched position.

In accordance with one aspect of the invention, latching mechanism 212 automatically latches together slide rails 302A, 302C when module 202 is in, for example, interior position 108. In the illustrative embodiment, this self-latching capability of linear slide 208L includes the ramped configuration of flat spring 306 described above. As module 202 is repositioned from an exterior position 110 to an interior position 108, intermediate portion 310B of flat spring 306 comes into contact with abutting surface 404 (FIG. 4B) of stationary slide rail 302C. This causes flat spring 306 to flex laterally inward toward movable slide rail 302A. Protrusion 308 has a beveled distal face 316 which also cooperates with abutting surface 404 to cause flat spring 306 to continue to flex inward as module 202 travels further into system rack 200. Ultimately protrusion 308 becomes aligned with apertures 214. Biased flat spring 306 then causes protrusion 308 to advance into apertures 214, as described above. Thus, in this illustrated embodiment, a user can insert module 202 into a restrained position in system rack 202 without having to lateral adjust handles 204.

It should be appreciated that movable latching member 212A can be made of any of a variety of complaint materials such as metal, plastic or other material. Also, other mechanically-biased mechanisms can be used in alternative embodiments to maintain protrusion 308 in the latched position. For example, movable latching member 212A could made of at least two pieces connected together and attached to slide rail 302A with a complaint spring to allow the same lever arm functionality as described above. The pieces of such a movable member could be fixed to each other in various ways which would be familiar to a person of ordinary skill in the art. Similarly, protrusion 308 can be crafted out of the same material as flat spring 306, as is illustrated, or be can a separate piece of material mounted on, and protruding from a flat spring 306.

While various embodiments of the present invention have been described above, it should be understood that they have been presented by way of example only, and not limitation. For example, the latching mechanism 212 can be implemented, for example, using magnetic, electro-magnetic or other approaches to semi-automatically or automatically restrain module 202 in a desired position relative to system rack 200. Further, the operation performed by the user to control the latching mechanism is a function of the type of latching approach implemented. Operating the latching mechanism may also be achieved in alternative embodiments by means other than laterally adjusting handles 204. For example, if a solenoid-controlled mechanical or magnetic latching device was used, a release switch may be provided on handle 204 or at some other location accessible by the user, including switches accessible, for example, with the user's feet. In one such example, all modules 202 mounted in system rack 200 tie into a centrally-controlled system which releases all modules 202 upon the activation of a single switch. Activation of the single switch or other invocation means will momentarily release all installed modules 202 to provide the ability to manually slide one particular module out of the rack. Because rack 200 is typically level when modules 202 are installed in the rack, momentarily releasing all installed modules 202 while manually controlling one particular module would not result in any other module inadvertently sliding out of the rack. As another example, the above embodiment of latching mechanism 212 is manually controllable by the user to release module 202 from its restrained interior position 108, and self-latches when the module is returned to the interior position from some other, extended position. However, latching mechanism 212 may require the user to perform an operation to latch module 202 into a desired position relative to system rack 200. It should also be appreciated from the above that the latched and unlatched positions described above are purely arbitrary; the present invention can be implemented to provide any number of latched and unlatched positions. Also, while the disclosed embodiments can provide an advantage in making the sliding and latching parts modular and adaptable to any component and rack, it should be appreciated that latching mechanism 212, or portions thereof, can be fixed directly to module 202, carrier rail system 210, system rack 200 or carrier bracket 400. As another example, the latching mechanism 212 and handle 204 can be integrated with a tray or shelf that supports a module 202 rather than a module 202 itself. It should further be appreciated that system rack 200 can comprise a support structure other than the four vertical posts commonly used in today's system racks. It should also be appreciated that, as noted, the present invention can be implemented in any other type of cabinet or enclosure as well. Accordingly, the invention is not to be limited by what has been particularly shown and described, except as indicated by the appended claims. All publications and references cited herein are expressly incorporated herein by reference in their entity.

What is claimed is:

1. A system rack configured to house rack-mount modules comprising:

a support structure;

a carrier rail system slidingly supporting a module, the carrier rail system comprising:

at least a first and a second linear slide each secured to the support structure on opposing sides of the module, wherein the first and second linear slide each comprise:

a stationary slide rail fixed to the support structure, wherein the stationary slide rail comprises an aperture;

a movable slide rail linear translatable relative to the stationary slide rail and fixed to the module; and a movable latching member coupled to the movable slide rail, wherein the movable latching member comprises a flat spring and a protrusion formed on a proximal end of the flat spring, wherein the flat spring is shaped such that the protrusion is biased away from the movable slide rail and toward the stationary slide rail; and wherein the aperture of the stationary slide rail is configured to latchingly receive the protrusion to latch the latching member and wherein the aperture lies within a plane that is substantially parallel to a line of translation of the movable slide rail;

wherein when the protrusion is aligned with the aperture, the biased flat spring advances the protrusion into the aperture to releasably restrain the module in an interior position in the support structure, and wherein the movable latching member further comprises a user-accessible handle disposed on a proximal end of the flat spring, wherein lateral adjustment of the handle away from its biased position causes the protrusion to retract from the aperture, thereby unlatching the latching member.

2. The system rack of claim 1, wherein the first and second linear slides each further comprise an intermediate slide rail, telescopically coupled to the stationary slide rail and the movable slide rail.

3. The system rack of claim 1, wherein the support structure comprises opposing sets of vertical posts, wherein the module is slidingly mounted between the opposing sets of posts, and wherein each linear slide is secured to one of the opposing sets of vertical posts, so as to mountingly receive the module.

4. The system rack of claim 3, wherein the carrier rail system further comprises:
a pair of carrier rail brackets mounted between two posts of each set of opposing sets of posts, each carrier rail bracket configured to attach to and support one of the linear slides.

5. The system rack of claim 1, wherein the movable latching member is operatively disposed on a proximal end of the movable slide rail.

6. The system rack of claim 1, wherein the user-accessible handle extends outward beyond a front face of the module and is fixed to the movable slide rail for moving the latching member between latched and unlatched positions and for sliding the moveable slide rail with respect to the stationary slide rail.

7. The system rack of claim 1, wherein the latching member latches automatically in response to placing the module in the restrained position.

8. The system rack of claim 1, wherein the rack-mount module is a server blade system.

9. A carrier rail system releasably securing a module slidingly mounted in a support structure, comprising:
at least one linear slide comprising:
a stationary slide rail fixed to the support structure, wherein the stationary slide rail comprises an aperture;
a movable slide rail linear translatable relative to the stationary slide rail and fixed to the module; and
a movable latching member coupled to the movable slide rail, wherein the movable latching member comprises a flat spring and a protrusion formed on a proximal end of the flat spring, wherein the flat spring is shaped such that the protrusion is biased away from the movable slide rail and toward the stationary slide rail; and
wherein the aperture of the stationary slide rail is configured to latchingly receive the protrusion to latch the latching member and wherein the aperture lies within a plane that is substantially parallel to a line of translation of the movable slide rail;
wherein when the protrusion is aligned with the aperture, the biased flat spring advances the protrusion into the aperture to releasably restrain the module in an interior position in the support structure; and
wherein the movable latching member further comprises a user-accessible handle disposed on a proximal end of the flat spring, wherein lateral adjustment of the handle away from its biased position causes the protrusion to retract from the aperture, thereby unlatching the latching member.

10. The carrier rail system of claim 9, wherein the at least one linear slide further comprises:
an intermediate slide rail, telescopically coupled to the stationary slide rail and the movable slide rail.

11. The carrier rail system of claim 9, wherein the carrier rail system further comprises:
at lease one carrier rail bracket configured to be mounted between two posts of the support structure and to attach to and support one of the linear slides.

12. The carrier rail system of claim 9, wherein the movable latching member is operatively disposed on a proximal end of the movable slide rail.

13. The carrier rail system of claim 9, wherein the user-accessible handle extends outward beyond a front face of the module and is fixed to the movable slide nil for moving the latching member between latched and unlatched positions and for sliding the moveable slide rail with respect to the stationary slide rail.

14. The carrier rail system of claim 9, wherein the latching member is configured to latch automatically in response to placing the module in the restrained position.

* * * * *

UNITED STATES PATENT AND TRADEMARK OFFICE
CERTIFICATE OF CORRECTION

PATENT NO. : 7,364,244 B2 Page 1 of 1
APPLICATION NO. : 10/437525
DATED : April 29, 2008
INVENTOR(S) : Alisa Sandoval It is certified that error appears in the above-identified patent and that said Letters Patent is hereby corrected as shown below:

In column 1, line 65, delete "10" and insert -- 110 --, therefor.

Signed and Sealed this

Nineteenth Day of August, 2008

JON W. DUDAS
*Director of the United States Patent and Trademark Office*